US010627450B2

(12) United States Patent
Fujii et al.

(10) Patent No.: US 10,627,450 B2
(45) Date of Patent: Apr. 21, 2020

(54) BATTERY STATE DETECTION DEVICE

(71) Applicant: Yazaki Corporation, Tokyo (JP)

(72) Inventors: Hironao Fujii, Susono (JP); Jian Wang, Susono (JP); Kei Matsumoto, Susono (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 315 days.

(21) Appl. No.: 15/825,285

(22) Filed: Nov. 29, 2017

(65) Prior Publication Data

US 2018/0210032 A1 Jul. 26, 2018

(30) Foreign Application Priority Data

Jan. 20, 2017 (JP) ................................ 2017-008368

(51) Int. Cl.

*G01R 31/382* (2019.01)
*G06F 17/40* (2006.01)
*B60L 58/12* (2019.01)
*G01R 31/392* (2019.01)
*G01R 31/389* (2019.01)

(52) U.S. Cl.

CPC ............ *G01R 31/382* (2019.01); *B60L 58/12* (2019.02); *G01R 31/389* (2019.01); *G01R 31/392* (2019.01); *G06F 17/40* (2013.01); *B60L 2240/12* (2013.01); *B60L 2240/547* (2013.01); *B60L 2240/549* (2013.01)

(58) Field of Classification Search

CPC ...... G01R 31/389; G01R 31/392; B60L 58/12
See application file for complete search history.

(56) References Cited

U.S. PATENT DOCUMENTS

2003/0090272 A1* 5/2003 Bertness ................ G01R 31/36 324/426
2004/0051534 A1* 3/2004 Kobayashi ....... G01R 19/16542 324/429
2005/0024061 A1* 2/2005 Cox ...................... B60W 20/12 324/426
2014/0217935 A1* 8/2014 Matsui .................... H02P 27/06 318/139
2014/0232411 A1* 8/2014 Vaidya ............... G01R 31/3648 324/426
2016/0056643 A1 2/2016 Syouda
2016/0069964 A1* 3/2016 Takahashi ............ H01M 10/48 324/433
2017/0187201 A1 6/2017 Wang et al.

FOREIGN PATENT DOCUMENTS

JP 2014-219311 A 11/2014
JP 2016-223051 12/2016

* cited by examiner

*Primary Examiner* — Alvaro E Fortich
(74) *Attorney, Agent, or Firm* — Sughrue Mion, PLLC

(57) ABSTRACT

Provided is a battery state detection device suitable for detecting a state of a battery mounted on a vehicle. A μCOM uses a first capacitor to measure a first sample of battery voltage, and after a predetermined standby time has elapsed, executes sample hold processing using the second capacitor for performing the second sample hold of the battery voltage. The μCOM detects the state of the battery based on the output of the differential amplifier when a condition is satisfied that the battery current is constant during both the first sample hold and the second sample hold and the battery current fluctuates during the standby time.

12 Claims, 6 Drawing Sheets

BATTERY STATE DETECTION DEVICE

TECHNICAL FIELD

The present invention relates to a battery state detection device.

BACKGROUND ART

For example, in an electric vehicle (EV) traveling using an electric motor, an electric vehicle such as a hybrid vehicle (HEV) that travels with the combined use of the electric motor and an engine as a power source, secondary batteries such as lithium ion rechargeable batteries and nickel hydride rechargeable batteries are installed.

Such a secondary battery is deteriorated by repeating charging and discharging, and the storageable capacity (current capacity, electric power capacity, etc.) gradually decreases. Then, in the electric vehicle, etc. using secondary battery, by detecting the degree of deterioration of the secondary battery, strageable capacity is obtained, calculating the travelable distance with the secondary battery, the lifetime of the secondary battery, and the like.

As one indicator of the degree of deterioration of the secondary battery used is SOH (State of Health) which is a ratio of a current strageable capacity to an initial strageable capacity. It is known that this SOH is correlated with an internal resistance of the secondary battery. Therefore, detecting the internal resistance of the secondary battery enables to obtain the SOH based on this internal resistance.

Generally, the internal resistance is very small, so it was difficult to obtain sufficient detection accuracy, and Patent Document 1 discloses a battery state detection device in which the detection accuracy of the internal resistance is enhanced.

FIG. 7 is a diagram showing a schematic configuration of a battery state detection device 500 described in Patent Document 1. The secondary battery B to be detected has an electromotive force portion e generating a voltage and an internal resistance r. Detecting this internal resistance r can obtain the SOH of the secondary battery B.

The secondary battery B generates a voltage V between both electrodes (positive electrode Bp and negative electrode Bn), which the voltage V is determined by a voltage Ve generated by the electromotive force generated by the electromotive force portion e and a voltage Vr generated by a current flow through the internal resistance r (V=Ve+Vr). The negative electrode Bn of the secondary battery B is connected to the reference potential G.

The battery state detection device 500 includes a differential amplification unit 511, a changeover switch 512, a first capacitor 513, a second capacitor 514, a charging unit 515, a first analog-digital convertor (ADC) 521, a second analog-to-digital converter (ADC) 522, and a microcomputer (μCOM) 540.

In the configuration shown in this figure, when the μCOM 540 transmits a charge start control signal through the output port PO2 to the charging unit 515, the charging unit 515 starts to flow a predetermined constant charging current Ic. As a result, charging of the secondary battery B is started.

When charging is started, the μCOM 540 controls the changeover switch 512 so that the positive electrode Bp of the secondary battery B and the first capacitor 513 are connected. As a result, the first capacitor 513 is charged and held (sampled and held) with the voltage V1=Ve+r·Ic between the two electrodes of the secondary battery B during charging.

Next, when the voltage both the electrodes of the secondary battery B acquired through the input port PI1 reaches the predetermined state detection voltage, the μCOM 540 controls the changeover switch 512 through the output port PO1, and connects the positive electrode Bp of the secondary battery B and the second capacitor 514, as well as transmits a charge stop control signal to the charging unit 515 through the output port PO2.

As a result, when the charging current Ic to the secondary battery B is stopped and the storage state of the second capacitor 514 is stabilized, the second capacitor 514 is sampled and held with the voltage V2=Ve between the two electrodes of the secondary battery B during stop of charging.

In this state, the μCOM 540 detects a differential voltage Vm the differential amplifier 511 outputs through the input port PI2. Then, the detected difference voltage Vm is divided by an amplification factor A of the differential amplifier 511, further divided by the charging current Ic, and the internal resistance r of the secondary battery B (=(Vm/Av)/Ic) is detected.

Finally, the μCOM 540 transmits a control signal of charging start signal to the charging unit 515 through the output port PO2. The charging unit 515 starts to flow the predetermined constant charging current Ic again in the secondary battery B according to this control signal. As a result, charging is started and the battery state detection process finishes.

PATENT DOCUMENT

[Patent Document 1] Japanese Unexamined Patent Application Publication No. 2014-219311

SUMMARY OF THE INVENTION

Disclosure of the Invention

The battery state detection device 500 described in the cited reference 1 can improve the output accuracy for the internal state resistance r of the secondary battery B, and can suppress the deterioration of the detection accuracy of the battery state.

Incidentally, when actually mounting the battery state detection device 500 on a vehicle, the charging current is varied by controlling the charging unit 515 only for detection of the state of the secondary battery B. That is, the secondary battery B mounted on the vehicle fluctuates battery current due to start of electricity or the like from start to supply electric power to the electric motor or charge start from the alternator. It is necessary to sample hold the voltage between both electrodes of the battery B before and after this battery current fluctuates. Therefore, even if sample hold is executed after detection of both electrodes of the battery B, it is impossible to sample hold the voltage between both electrodes of the battery B in two before and after states.

The present invention has been made in view of the above background, and aims at providing a battery state detecting device suitable for battery state detection for a battery mounted to the vehicle.

Means for Solving the Problems

A battery voltage detection device according to a first aspect of the present invention includes a first capacitor; a second capacitor; a differential amplifier for outputting a voltage corresponding a differential voltage between a voltage held by the first capacitor and a voltage held by the second capacitor; a sample hold control unit for executing sample hold processing for performing a first sample hold of a battery voltage of the battery using the first capacitor, and a second sample hold of the battery voltage using the second capacitor after a predetermined standby time has elapsed; and a battery state detection unit for detecting a state of the battery based on an output of the differential amplifier when a condition is satisfied that a battery current both during the first sample hold and during the second sample hold is constant and the battery current during the standby time fluctuates.

In the battery voltage detection device according to a second aspect, the sample hold control unit repeatedly executes the sample hold processing until the condition is satisfied.

In the battery voltage detection device according to a third aspect, the sample hold control unit restarts the first sample hold when determining the condition is not satisfied during the sample hold processing.

A battery voltage detection device according to a fourth aspect is mounted in a vehicle, and the sample hold control unit executes the sample hold processing in accordance with a stop of the vehicle.

In the battery voltage detection device according to a fifth aspect, the sample hold control unit executes a pre-sample hold of the battery voltage using the first capacitor before executing the sample hold processing.

Advantages of the Invention

According to the first aspect as described above, the battery state detection unit executes the sample hold processing and detects the state of the battery when the condition is satisfied that the battery current both during the first sample hold and during the second sample hold is constant and the battery current during the standby time fluctuates. As a result, it is possible to obtain the battery state detection device suitable for detection of the state of the battery mounted in the vehicle.

According to the second aspect, the sample hold processing is repeatedly executed until the above condition is satisfied. Thereby, it is possible to further improve the battery state detection device suitable for detecting the state of the battery mounted in the vehicle.

According to the third aspect, if it is determined during the sample hold processing that the above condition is not satisfied, start over from the first sample hold. As a result, it is possible to obtain the battery state detection device further suitable for detecting the state of the battery.

According to the fourth aspect, while the vehicle is stopped, the battery current is a constant value (for example, 0), charge or discharge for the battery is then performed, and the battery current fluctuates. Therefore, the sample hold control unit can quickly detect the state of the battery voltage by executing the sample hold processing in response to the stoppage of the vehicle.

According to the fifth aspect, pre-sample hold is performed using the first capacitor. Thus, decrease of the voltage across the first capacitor is reduces due to the influence of the DC bias characteristics of the ceramic capacitor, suppressing reduction of measurement accuracy of the differential voltage. Also, usage of ceramic capacitor can achieve cost reduction and downsizing of the device.

MODE FOR CARRYING OUT THE INVENTION

First Embodiment

Figure 1:
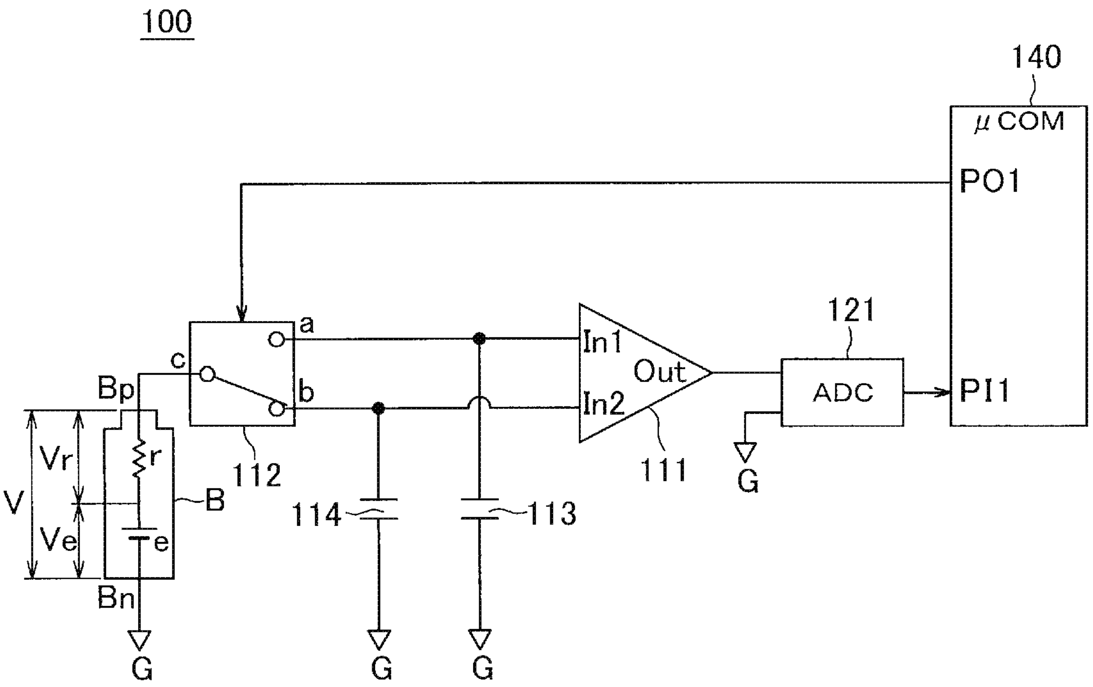
FIG. 1 is a schematic configuration diagram showing a battery state detection device of the present invention in a first embodiment.

A first embodiment of the present invention will be described in detail with reference to the drawings. FIG. 1 is a schematic configuration diagram showing a battery state detection device of the present invention.

The battery state detection device 100 of the present embodiment is mounted on an electric vehicle, for example, is connected between the electrodes of the secondary battery the electric vehicle includes, and detects as a state of the secondary battery an internal resistance of the second battery. It is needless to say that the device can be applied to an apparatus or a system or the like provided with a secondary battery other than the electric vehicle.

The secondary battery B (=battery) to be detected is connected to a load such as an electric motor (not shown), or a charger such as a battery charger, the secondary battery B is discharged by the load, and charged by the charger. In addition, the secondary battery B has an electromotive force portion e and an internal resistance r that generate a voltage. Detecting the internal resistance r can obtain the SOH of the secondary battery B.

The secondary battery B generates a voltage V between both electrodes (positive electrode Bp and negative electrode Bn), this voltage V is determined by a voltage Ve generated by the electromotive force generated by the electromotive force portion e and a voltage Vr generated by a current flowing through the internal resistance r($V=Ve+Vr$). The negative electrode Bn of the secondary battery B is connected to the reference potential G.

As shown in the figure, the battery state detecting apparatus 100 includes a differential amplifier 111, a changeover switch 112, a first capacitor 113, a second capacitor 114, an analog-to-digital converter (ADC) 121, and a microcomputer (μCOM) 140.

The differential amplifier 111 is constituted by, for example, an operational amplifier or the like, and has two input terminals (a first input terminal In1 and a second input terminal In2) and one output terminal (output terminal Out), and outputs from the output terminal a differential voltage Vm obtaining by amplifying the differential value of the voltage input to these two input terminals with a predetermined amplification factor Av.

The changeover switch 112 is, for example, a single circuit two contact switch (SPDT (single pole double throw)). The changeover switch 112 has a switching terminal of two switching terminals a and b connected to the first input terminal In1 of the differential amplifier 111, and has the switching terminal b connected to the second input terminal In2 of the differential amplifier 111. Further, the changeover switch 112 has the common terminal c connected to the positive electrode Bp of the secondary battery B.

The first capacitor 113 is connected between the first input terminal In1 of the differential amplifier 111 and the reference potential G. That is, the first capacitor 113 is disposed between the first input terminal In1 and the negative electrode Bn of the secondary battery B. As a result, the first input terminal In1 holds the voltage between the first input terminal In1 and the negative electrode Bn of the secondary battery B.

The second capacitor 114 is connected between the second input terminal In2 of the differential amplifier 111 and the reference potential G. That is, the second capacitor 114 is disposed between the second input terminal In2 and the negative electrode Bn of the secondary battery B. As a result, the second capacitor 114 holds the voltage between the second terminal In2 and the negative electrode Bn of the secondary battery B.

Here, in the battery state detection device 100 of the present embodiment, the first capacitor 113 and the second capacitor 114 are composed of a ceramic capacitor. Further, in the state detection device 100 of the present embodiment, the capacitance of the first capacitor 113 and the capacitance of the second capacitor 114 differ from each other, the capacitance of the first capacitor 113 which stores charges first is set larger than that of the second capacitor 114. Generally, with capacitors, the larger the capacity, the more the influence of voltage drop can be reduced due to leakage current, and the smaller the capacity, the shorter the time required for the sample hold. Note that the capacitances of the first capacitor 113 and the second capacitor 114 may be the same.

The ADC 121 outputs the signal indicating a digital value corresponding to the differential voltage Vm output from the differential amplifier 111.

The μCOM 140 includes a built-in CPU, ROM, RAM, and the like, and sample hold control unit, and serves a battery state detection unit to control the entire battery state detection device 100. The μCOM 140 has a first output port PO1 etc. connected to the changeover switch 112. The μCOM 140 transmits a control signal to the changeover switch 112 via the first output port PO1 so as to control the changeover switch 112. Vehicle speed information from the vehicle speed sensor, battery current information from the current sensor flowing through the secondary battery B, etc. are input to the μCOM 140.

The μCOM 140 has a first input port PI1 to which a signal output from the ADC 121 is input. The μCOM 140 detects the internal resistance r of the secondary battery B based on the difference voltage Vm of the differential amplifier 111 input from the first input port PI1.

Next, the operation of the above-described battery state detection device 100 is described with reference to the flowchart shown in FIG. 2.

Figure 2:
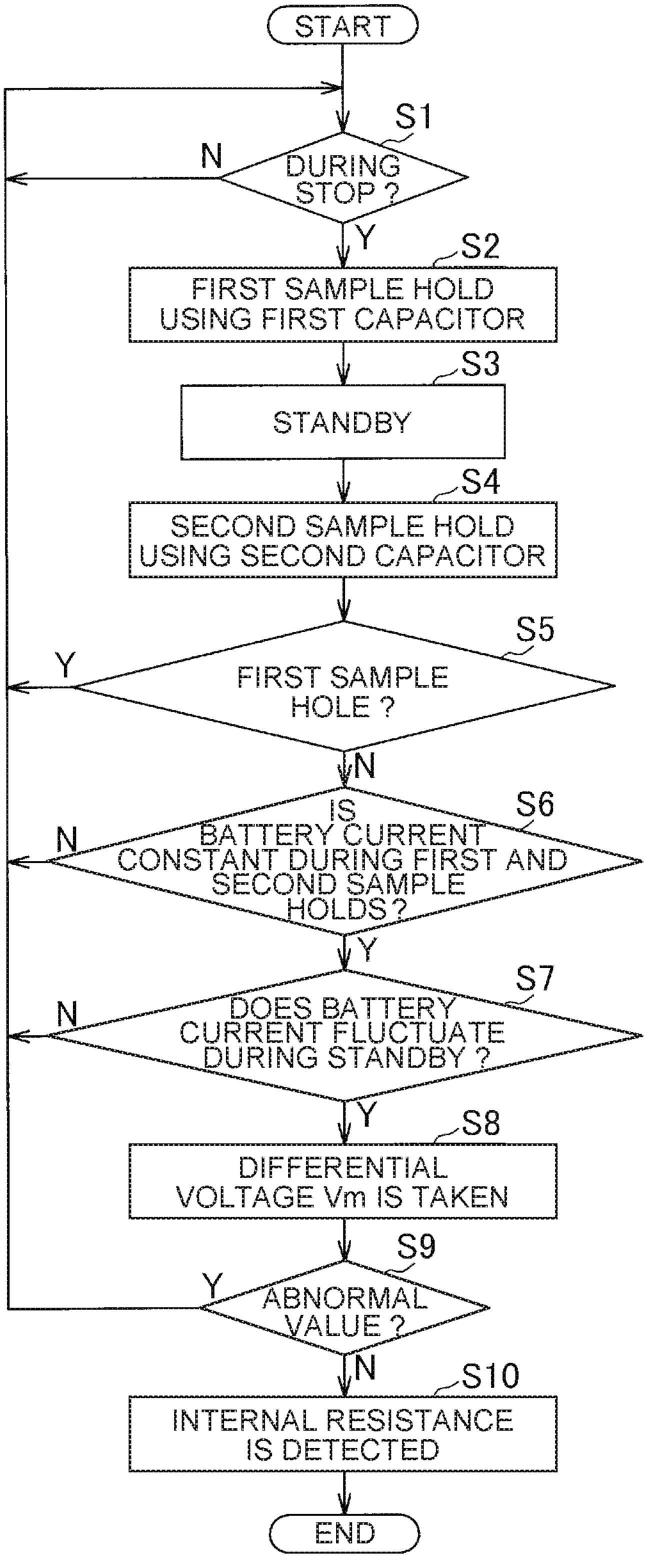
FIG. 2 is a flowchart showing a battery state detection processing procedure of the μCOM shown in FIG. 1.

The μCOM 140 starts the operation shown in FIG. 2 in accordance with ignition on of the vehicle or the like. First, the μCOM 140 determines whether the speed of the vehicle is 0 and the vehicle is stopped based on the speed information (Step S1).

If the vehicle is stopped (Y in step S1), the μCOM 140 uses the first capacitor 113 and first samples/holds the first sample of the battery voltage (=voltage between both electrodes of the secondary battery B) (step S2). In step S2, the μCOM 140 transmits a control signal for connecting the switching terminal a and the common terminal c to the switching switch 112 through the first output port PO1.

The changeover switch 112 connects the positive electrode Bp of the secondary battery B and the first input terminal In1 of the differential amplifier 111 by connecting the switching terminal a and the common terminal c.

As a result, the first capacitor 113 is connected between the positive electrode Bp and the negative electrode Bn of the secondary battery B, and electric charge from the secondary battery B flows into the first capacitor 113. And, after a certain lapse of time the battery voltage is held as the first voltage in the first capacitor 113.

In step S2, the μCOM 140 holds the battery voltage in the first capacitor 113, the connection between the first capacitor 113 and the secondary battery B is disconnected and the first sample hold ends. That is, the μCOM 140 transmits to the changeover switch 112 a control signal for disconnecting both the switching terminal a and the switching terminal b from the common terminal c.

Note that whether or not the battery voltage is held in the first capacitor 113 may be determined by the elapsed time after the secondary battery B is connected to the first capacitor 113, or by the battery voltage of the battery B. Thereafter, the μCOM 140 waits for a predetermined standby (step S3).

When the standby time (for example, 1 s) elapses, the μCOM 140 uses the second capacitor 114 and samples/holds the second sample of the battery voltage (step S4). In step S4, the μCOM 140 transmits a control signal for connecting both the switching terminal b and the common terminal c to the changeover switch 112 via the first output terminal PO1.

As a result, the second capacitor 114 is connected between the positive electrode Bp and the negative electrode Bn of the secondary battery B, and the electric charge from the secondary battery B flows into the second capacitor 114. And, after a certain lapse of time the battery voltage is held as the second voltage in the second capacitor 113.

In step S4, the μCOM 140, when the battery voltage is held in the second capacitor 114, disconnects the second capacitor 114 and the secondary battery B, and the second sample hold ends. That is, the μCOM 140 transmits to the changeover switch 112 a control signal for disconnecting both the switching terminal a and the switching terminal b from the common terminal c. Whether or not the battery voltage is held in the second capacitor 114 may be determined by the elapsed time after the secondary battery B is connected to the second capacitor 114, or by the battery voltage of the pressure B.

Thereafter, the μCOM 140 returns the process to step S1 if the sample hold processing performed in steps S2 to S4 is the first sample hold process (Y in step S5). As a result, the sample hold processing in steps S1 to S4 is repeatedly executed.

The μCOM 140, if the sample hold processing performed in steps S2 to S4 is the second (N in step S5), determines whether or not the battery current has been constant in the batteries both during the first sample hold and the second sample hold (step S6). In S6, the μCOM 140 determines it using the battery current information from the current sensor.

If determined NO (N in step S6), the μCOM 140 returns to step S1. If the battery current is constant during both 1 sample hold and 2nd sample hold (Y in Step S6), the μCOM 140 determines that the constant currents I1 and I2 have flowed to the secondary battery B during the first sample hold and the second sample hold, and the process proceeds to step S7.

In step S7, the μCOM 140 determines whether or not the battery current fluctuates during the standby time (Step S7).

In step S7, the μCOM 140 determines using battery current information from the current sensor. When determined as negative (N in step S7), μCOM 140 returns to step S1. When the battery current fluctuates during the standby time (Y in step S7), the μCOM 140 determine that the constant current I1 flowing to the secondary battery B during the first sample hold and the constant current I2 flowing through the secondary battery B during the second sample hold is different from each other, and the process proceeds to the next step S8.

In step S8, the μCOM 140 takes thereinto the differential voltage Vm from the differential amplifier 111. If the obtained difference voltage Vm is not an abnormal value (N in step 9), the μCOM 140 treats the fetched differential voltage Vm as valid and calculates the internal resistance r of the secondary battery B based on the differential voltage Vm (Step S10), and ends the process. The internal resistance r in step S10 is obtained such that not only the differential voltage Vm but also the constant current I1 during the first sample hold measured by the current sensor, and the constant current I2 during the second sample hold are substituted into the following equation (1).

$$r=(Vm/Av)/(I1-I2) \quad (1)$$

In the above equation (1), I1 and I2 represent currents in the charge direction as + and currents in the discharge direction as −. Further, in the present embodiment, since the process is started when the vehicle stops, as the constant current I1 is measured 0.

On the other hand, if it is an abnormal value (Y in step S9), the μCOM 140 treats the fetched differential voltage Vm as invalid and the process returns to step S1 without obtaining the internal resistance r.

Figure 3:
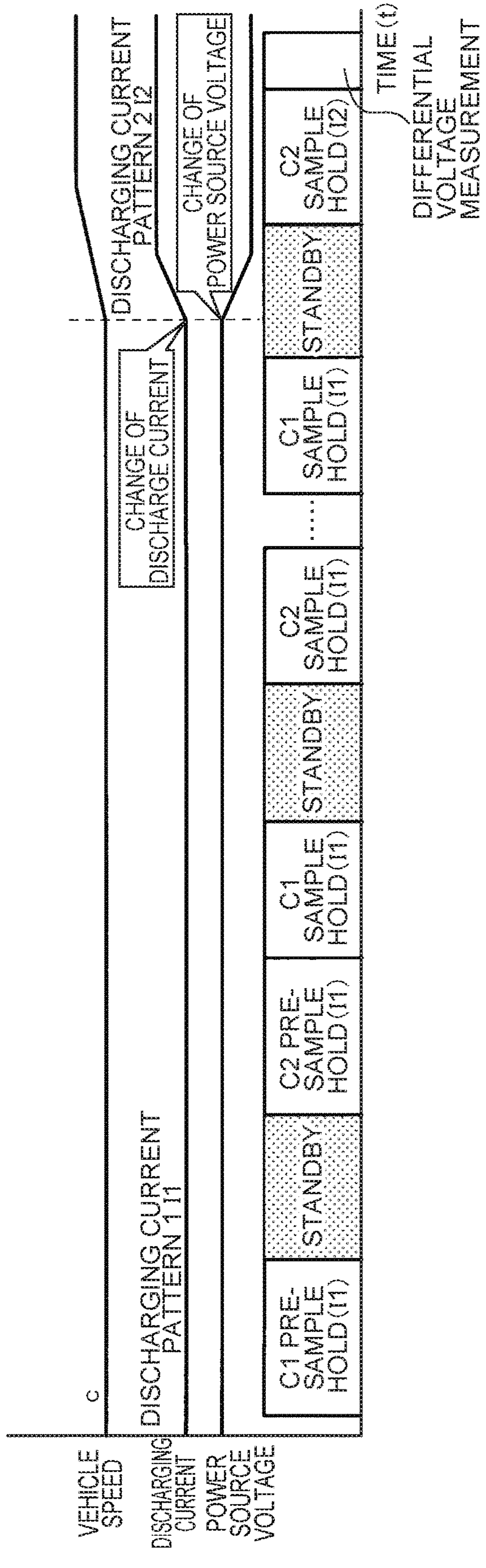
FIG. 3 is a time chart for explaining an operation of the battery state detection device shown in FIG. 1.

Next, the operation of the battery state detection device 100 described above with reference to FIG. 3 will be described. As shown in the figure, when the vehicle speed becomes 0, the μCOM 140 sequentially execute the first sample hold using the first capacitor 113 for the first time, standby, and the second sample hold using the second capacitor 114. The μCOM 140 does not obtain the internal resistance r from the differential voltage Vm after the first sample hold and second sample hold are performed. That is, the first sample hold and second sample hold of the first time become pre-sample hold. Then, the μCOM 140 obtains the internal resistance r from the difference voltage Vm after executing the first sample hold and the second sample hold after the second time.

Thereafter, while the vehicle speed is 0 and the discharging current is a constant value (for example, 0), the μCOM 140 repeatedly executes sample hold processing (first sample hold, standby, second sample hold). Thereafter, when the vehicle starts to move and the discharge current of the secondary battery B fluctuates during standby, μCOM 140, after completion of the second sample hold, calculates the internal resistance r from the output of the differential amplifier 111.

According to the embodiment described above, when the condition is satisfied that the battery current is constant both during the first sample hold, and that the second sample hold and battery current fluctuates during standby time, the μCOM 140 detects a state of the internal resistance r. As a result, the internal resistance r can be easily detected without missing the timing when to detect the internal resistance r.

Further, according to the above-described embodiment, the μCOM 140 continues to repeatedly execute the sample hold processing of steps S2 to S4 until the above conditions are satisfied. As a result, even more, the internal resistance r can be easily detected without missing the timing when to detect the internal resistance r.

Further, while the vehicle is stopped, the battery current is a constant value (for example, 0), and thereafter, when the vehicle travels, charging or discharging of the pond B is performed, and the battery current fluctuates. Therefore, the μCOM 140 can detect the internal resistance r quickly without repeating the sample hold process too much by executing the sample hold processing of steps S2 to S4 in response to the stoppage of the vehicle.

By the way, in an actual capacitor, the phenomenon occurs that the accumulated charge is released due to a minute leakage current. Therefore, the electric charge slightly escapes due to the leakage current in the time after sampling and holding with the first capacitor 113 until sample hold is completed with the second capacitor 114. When charge escapes from the first capacitor 113, the battery voltage is measured to be lower than the actual voltage, which leads to deterioration of measurement accuracy.

Further, in order to reduce the cost and size of this type of device, it is preferable that a ceramic capacitor is used for the first capacitor 113 and the second capacitor 114. However, in the ceramic capacitor, by a characteristic DC bias characteristic that the more voltage increases the more electrostatic capacity decreases, the sampled/held charge escapes by the leakage current, the holding voltage decreases, leading the electrostatic capacity to decrease, which poses problem that the holding voltage is further reduced and the measurement accuracy further deteriorates.

According to the above-described embodiment, the μCOM 140, before performing sample hold processing (second and subsequent sample hold), performs pre-sample hold (first sample hold) for the battery voltage using the first capacitor 113. As a result, the detection accuracy of the internal resistance r is less likely to deteriorate due to the influence of the DC bias characteristic of the ceramic capacitor.

Figure 4:
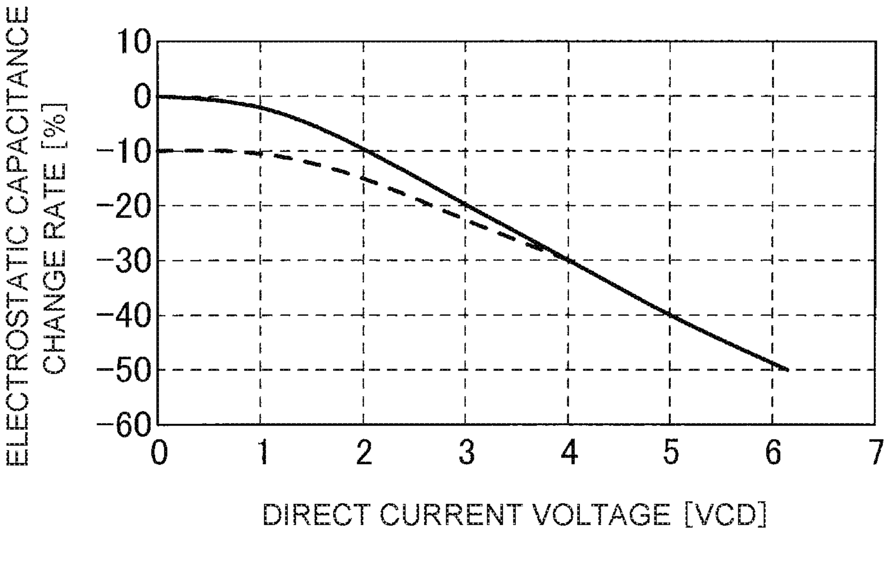
FIG. 4 is a graph showing an example of a DC bias characteristic of a ceramic capacitor.

FIG. 4 shows an example of the DC bias characteristics of the ceramic capacitor. In FIG. 4, the vertical axis represents electrostatic change rate, and the horizontal axis the direct current voltage. The solid line in FIG. 4 indicates the characteristics when the pre-sample hold is not performed, and the dotted line the characteristics when pre-sample hold is performed.

As shown in FIG. 4, it is known that once the ceramic capacitor is subjected to voltage application, an effective electrostatic capacity decreases. In addition, a phenomenon is also known that the ceramic capacitor, when discharged after being applied with voltage to charge, changes to the characteristic that is based on the decreased capacity as indicated by the dotted line.

Therefore, once the DC voltage is applied to the ceramic capacitor to charge it, after it stops once, the ceramic capacitor is discharged by leak current, which can changes the characteristics from the solid line to the dotted line in FIG. 4. As clearly seen from FIG. 4, the characteristic of the dotted line is gentle than the characteristic of the solid line in electrostatic capacitance change rate. In other words, characteristics are changed by pre-sample hold operation and sample hold for actual measurement is performed, which suppresses an increase in electrostatic capacity accompanied by voltage drop due to leak current, and reduces the effect of the voltage drop of the first capacitor 113 and the second capacitor 114.

According to the above-described embodiment, a waiting time is also provided between the pre-sample hole using the first capacitor 113 and pre-sample hold using the second capacitor 114, however, it is not limited to this. Pre-sample hold using the first capacitor 113 without waiting time may be followed by the pre-sample hold using the second capacitor 114.

Further, according to the above-described embodiment, although the pre-sample hole using the second capacitor 114, it is not limited to this. What becomes problematic due to voltage drop of the capacitor due to the leak current when fetching the differential voltage Vm is the first capacitor 113 for which the pre-sample hold is performed. Therefore, the pre-sample hold may be performed using the first capacitor 113, the pre-sample hold may not be performed using the second capacitor 114.

Further, according to the above-described embodiment, the pre-sample hold is performed, but is not limited to this. Pre-sample hold is not indispensable, and may not be performed.

Further, according to the above-described embodiment, the μCOM 140 performs the sample hold processing of steps S2 to S4, but it is not limited to this. For example, at the timing when the current flowing through the secondary battery B becomes constant, the sample hold steps S2 to S4 are also performed.

Further, according to the above-described embodiment, the μCOM 140 repeats until the condition is satisfied that battery current is constant both during the first sample hold and the second sample hold and change of battery current fluctuates during standby time, but is not limited to that. For example, when the battery current is not constant during the first sample hold, the μCOM 140 may return to step S2 again and starts from the first sample hold. Also, if the battery current does not change during the standby time, the μCOM 140 returns again to step 2, and starts from the first sample hold. Also, if the battery current is not constant during the second sample hold, the μCOM 140 returns to step S2 again, and starts from the first sample hold. That is, if the above condition is not determined to be satisfied during sample hold processing, the sample hold processing is not continued as it is, the first sample hold processing is not kept, and starts from the first sample hold. Also in this case, it is possible to easily detect the internal resistance r without missing the timing when the internal resistance r is detected.

Further, according to the above-described embodiment, μCOM 140, when the condition is not satisfied, performs sample hold processing of steps S2 to S4, but it is not limited to this. The sample hold process may not repeat but the sample hold process may be performed at another timing.

Second Embodiment

Figure 5:
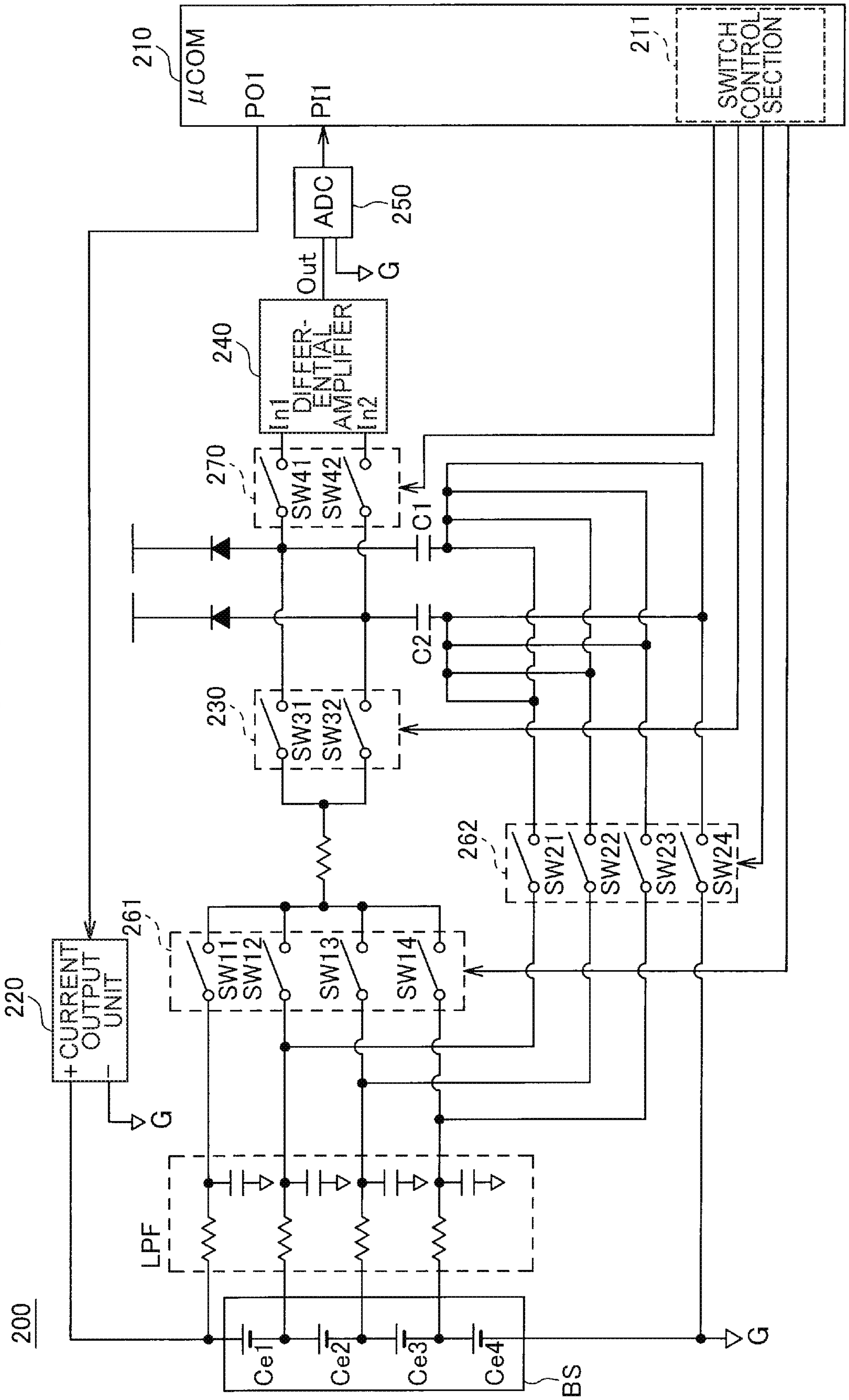
FIG. 5 is a schematic configuration diagram showing a battery state detection device of the present invention in a second embodiment.

A second embodiment of the present invention will be described in detail with reference to the drawings. FIG. 5 is a schematic configuration diagram showing a battery state detection device of the present invention in the second embodiment. The battery state detection device 200 is one applying the technology of the battery state detection device 100, and targets the assembled battery BS as a voltage source of the object to be measured in which a plurality of cell batteries (Ce1 to Ce4; batteries) is combined.

As shown in the figure, the battery state detection device 200 includes a first capacitor C1, a second capacitor C2, μCOM 210, a changeover switch 230, a differential amplifier 240, ADC 250, a detection object selection switch 261, a reference potential setting switch 262, and a protection switch 270.

The first capacitor C1 holds the voltage of the measurement target portion in the assembled battery BS in the first state as the first voltage. The second capacitor C2 holds the voltage of the measurement target portion in the assembled battery BS in the first state as the second voltage. Here, the capacitance of the first capacitor C1 is made larger than the capacitance of the second capacitor C2. Note that the first capacitor C1, the second capacitor C2 may be the same.

The changeover switch 230 is provided with a switch SW31 introducing the voltage of the measurement target portion in the assembled battery BS in the first state (the first voltage) to the first capacitor C1, and a switch SW32 introducing the voltage of the measurement target portion in the assembled battery BS in the second state (the second voltage) to the second capacitor C2.

The detection object selection switch 261 is provided between an end of each cell battery (Ce1 to Ce4) and the changeover switch 230. Specifically, SW11 is provided between the end of the cell battery Ce1 corresponding to the positive electrode side of the assembled battery BS and the changeover switch 230, SW12 is provided between the connection point between the battery cell Ce1 and the cell battery Ce2, and SW13 is provided between the connection point between the cell battery Ce2 and the cell battery Ce3 and the changeover switch 230, SW14 is provided between the connection point between the cell battery Ce3 and the cell battery Ce4 and the changeover switch 230.

The reference potential setting switch 262 switches the reference potential of the first capacitor C1 and the second capacitor C2. Specifically, SW24 for setting the reference potential of the first capacitor C1 and the second capacitor C2 to the reference potential G, SW 23 for setting the reference potential of the first capacitor C1 and the second capacitor C2 to the voltage of the cell battery Ce4, SW22 for setting the reference potential of the first capacitor C1 and the second capacitor C2 to the voltage of the cell battery Ce4+cell battery Ce3, and SW21 for setting the reference potential of the first capacitor C1 and the second capacitor C2 to the voltage of the cell battery Ce4+cell battery Ce3+cell battery Ce2.

The protection switch 270 is for protecting the differential amplification unit 240 and also for reducing the leak current to the differential amplifier 240 connected to the first capacitor C1 and the capacitor C2. The protection switch 270 is for introducing the first voltage and second voltage to the differential amplifier 240 after the sample hold is completed with the first capacitor C1 and the second capacitor C2, and is provided with a switch SW41 provided between the first capacitor C1 and the first input terminal In1, and a SW 42 provided between the second capacitor C2 and the second input terminal In2. Both SW41 and SW42 are turned off during sample hold, and are turned on when sample hold is completed, and the first voltage and the second voltage are led to the differential amplifier 240.

The differential amplifier 240 has two input terminals (a first input terminal In1 and a second input terminal In2) and one output terminal (output terminal Out), and differential value of the voltage input to these two input terminals is amplified with a predetermined amplification factor Av, and outputs a difference voltage Vm from the output terminal.

The ADC 250 outputs the signal indicating digital signal corresponding to the differential voltage Vm output from the differential amplifier 240.

The μCOM 210 includes a built-in CPU, ROM, RAM, and the like, and functions as a control unit to control the entire differential voltage measuring apparatus 200. The μCOM 210 is provided with a first output port PO1 connected to the current output unit 220, a first input port PI1 to which a signal output from the ADC 250 is input, and a switch control section 211 for controlling each switch.

For example, the battery state detection device 200 can obtain the SOH for each cell battery by measuring the internal resistance r of each cell battery. In the case of measuring the internal resistance of the cell battery Ce1, only the SW 11 is turned on for the output target selection switch 261, and the SW 21 of the reference potential setting switch 262 is set on. As a result, the voltage between both terminals of the cell battery Ce1 is introduced to the second capacitor C2.

The protection switch 270 is turned on to lead the first voltage and the second voltage to the differential amplifier 240, and a voltage difference is input to the μCOM 210. The μCOM 210, similar to the same principle as in the first embodiment, can obtain the internal resistance r1 of the cell battery Ce1 with r1=(Vm/Av)/(I1−I2). The internal resistance of other cell batteries can also be determined in the same way.

In the second embodiment, the switch control unit 211 can measure various potential differences by operating the detection object selection switch 261 and the reference potential setting switch 262.

For example, with only the SW21 of the reference potential setting switch 262 turned on, detection object select switch 261 is turned on only for SW11 to acquire the first voltage, and thereafter, only the switch SW12 of the detection object selection switch is turned on to acquire the second voltage, the differential voltage between the first voltage and the second voltage is measured, and the measurement result shows the potential difference between both ends of the cell battery Ce1, that is, the voltage of the cell battery Ce1. Voltages of other cell batteries can be similarly obtained.

Also in the second abovementioned embodiment, when the condition is satisfied that the battery current is constant both during the first sample hold, and that the second sample hold and battery current fluctuates during standby time, the μCOM 140 detects a state of the internal resistance r.

Figure 6:
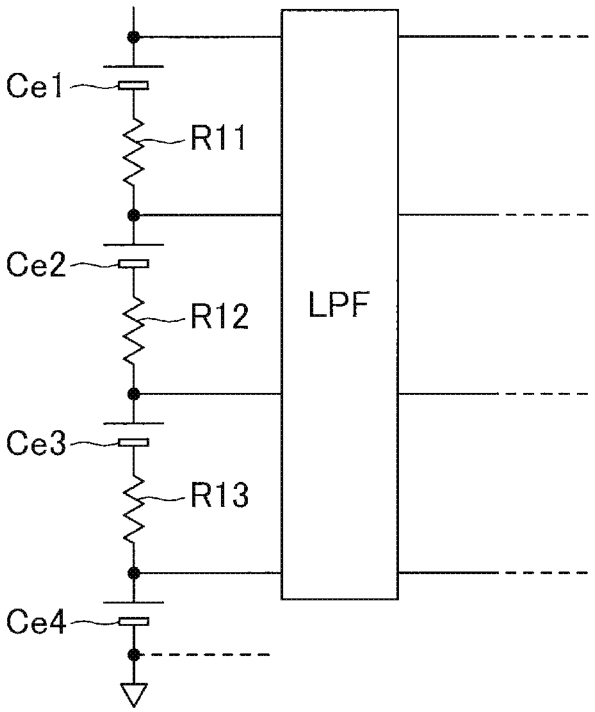
FIG. 6 is a view for explaining contact/wiring resistance connected between the cell batteries shown in FIG. 5.
Figure 7:
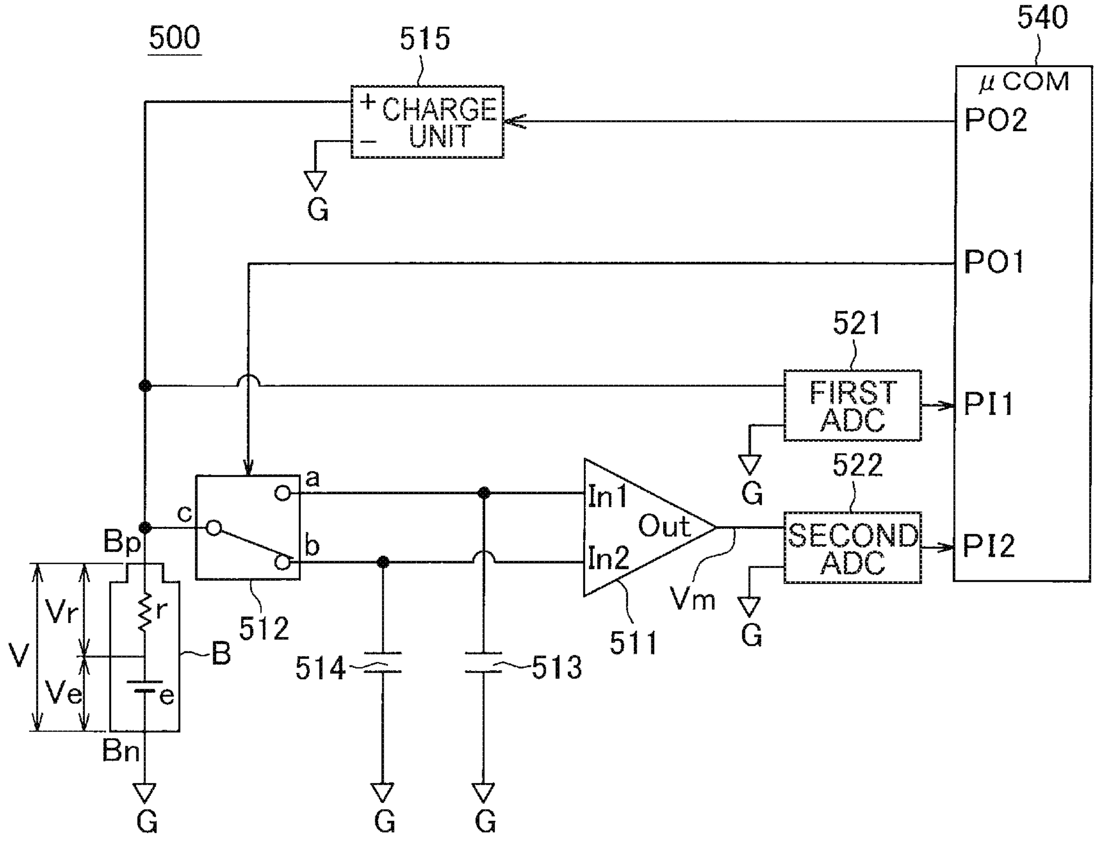
FIG. 7 is a schematic configuration diagram showing an example of a conventional battery state detection device.

Incidentally, according to the abovementioned second embodiment, contact resistance and wiring resistance in the cell batteries Ce1 to Ce4 with the bus bar for connecting with the respective adjacent cell batteries Ce1 to Ce4 occur. That is, as shown in FIG. 6, contact/wiring resistances R11 to R13 occur between the cell batteries Ce1 to Ce4. Then, the first voltage and the second voltage held in the first capacitor C1 and the second capacitor C21 include not only the voltage across the cell batteries Ce1 to Ce4, but also the voltage drop caused by the contact/wiring resistors R11 to R13. Therefore, the differential voltage Vm after the differential output voltage 240 of the cell battery Cen (n is an arbitrary integer from 1 to 3) is output includes not only the voltage difference ΔV between the both ends of the cell battery Cen but also the voltage drop occurring in the contact/wiring resistance R1*n* as shown in the following equation (2);

$$Vm=Av\{\Delta V+R1n(I1-I2)\} \tag{2}$$

Therefore, before the shipment, the contact/wiring resistances R11 to R13 are measured and stored in a not-shown memory, the μCOM 210 stores the contact/wiring resistances R11 to R13 stored in the memory may be substituted into equation (3) to obtain the internal resistance rn;

$$rn=\{(Vm/Av)-R1n(I1-I2)\}/(I1-I2) \tag{3}$$

As a result, it is possible to further improve the detection accuracy of the internal resistance rn.

It should be noted that the present invention is not limited to the above embodiment. That is, various modifications can be made without deviating from the gist of the present invention.

DESCRIPTION OF SYMBOLS

100 battery state detection device
111 differential amplifier
113 first capacitor
114 second capacitor
140 μCOM (sample hold control unit, battery state detection unit)
200 battery state detection device
210 μCOM (sample hold control unit, battery state detection unit)
240 differential amplifier
B secondary Battery (Battery)
C1 first capacitor
C2 second capacitor
Ce1-Ce4 cell battery (battery)

The invention claimed is:

1. A battery state detection device for detecting a state of a battery, comprising:
- a first capacitor;
- a second capacitor;
- a differential amplifier for outputting a voltage corresponding to a differential voltage between a voltage held by the first capacitor and a voltage held by the second capacitor;
- a current censor for detecting a battery current flowing through the battery; and
- a microcomputer having the current censor connected thereto, the microcomputer configured to:
  - execute sample hold processing for performing a first sample hold of a battery voltage of the battery using the first capacitor, and a second sample hold of the battery voltage using the second capacitor after a predetermined standby time has elapsed;
  - determine whether the battery current detected by the current censor satisfies a condition that the battery current is constant both during the first sample hold and during the second sample hold and fluctuates during the standby time, and
  - detect a state of the battery based on an output of the differential amplifier when the condition is satisfied.

2. The battery state detection device according to claim 1, wherein the microcomputer is configured to repeatedly execute the sample hold processing until the condition is satisfied.

3. The battery state detection device according to claim 1, wherein the microcomputer is configured to restart the first sample hold when the condition is determined not to be satisfied during the sample hold processing.

4. The battery state detection device according to claim 1, wherein
- the battery state detection device is mounted on a vehicle, and wherein
- the microcomputer is configured to execute the sample hold processing in accordance with a stop of the vehicle.

5. The battery state detection device according to claim 2, wherein
- the battery state detection device is mounted on a vehicle, and wherein the microcomputer is configured to execute the sample hold processing in accordance with a stop of the vehicle.

6. The battery state detection device according to claim 3, wherein the battery state detection device is mounted on a vehicle, and wherein the microcomputer is configured to execute the sample hold processing in accordance with a stop of the vehicle.

7. The battery state detection device according to claim 1, wherein the microcomputer is configured to execute a pre-sample hold of the battery voltage using the first capacitor before executing the sample hold processing.

8. The battery state detection device according to claim 2, wherein the microcomputer is configured to execute a pre-sample hold of the battery voltage using the first capacitor before executing the sample hold processing.

9. The battery state detection device according to claim 3, wherein the microcomputer is configured to execute a pre-sample hold of the battery voltage using the first capacitor before executing the sample hold processing.

10. The battery state detection device according to claim 4, wherein the microcomputer is configured to execute a pre-sample hold of the battery voltage using the first capacitor before executing the sample hold processing.

11. The battery state detection device according to claim 5, wherein the microcomputer is configured to execute a pre-sample hold of the battery voltage using the first capacitor before executing the sample hold processing.

12. The battery state detection device according to claim 6, wherein the microcomputer is configured to execute a pre-sample hold of the battery voltage using the first capacitor before executing the sample hold processing.

* * * * *